United States Patent
Yamada

(10) Patent No.: US 10,394,018 B2
(45) Date of Patent: Aug. 27, 2019

(54) OPTICAL SCANNING DEVICE

(71) Applicant: Tsukasa Yamada, Tokyo (JP)

(72) Inventor: Tsukasa Yamada, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 66 days.

(21) Appl. No.: 15/696,503

(22) Filed: Sep. 6, 2017

(65) Prior Publication Data

US 2018/0088320 A1    Mar. 29, 2018

(30) Foreign Application Priority Data

Sep. 28, 2016 (JP) .................................. 2016-190260

(51) Int. Cl.
  *G02B 26/08* (2006.01)
  *H01L 41/09* (2006.01)
  *G02B 26/10* (2006.01)
(52) U.S. Cl.
  CPC ...... *G02B 26/0858* (2013.01); *H01L 41/0953* (2013.01); *G02B 26/101* (2013.01)
(58) Field of Classification Search
  CPC .............. G02B 26/0858; G02B 26/105; G02B 26/101; H01L 41/00
  See application file for complete search history.

(56) References Cited

U.S. PATENT DOCUMENTS

| | | | |
|---|---|---|---|
| 8,941,905 B2* | 1/2015 | Aimono | G02B 26/10 359/199.4 |
| 2012/0033279 A1 | 2/2012 | Furukawa et al. | |
| 2013/0258432 A1 | 10/2013 | Aimono et al. | |
| 2014/0226194 A1 | 8/2014 | Mihara et al. | |
| 2015/0036201 A1 | 2/2015 | Horie et al. | |
| 2015/0323783 A1 | 11/2015 | Horie et al. | |

FOREIGN PATENT DOCUMENTS

| | | |
|---|---|---|
| EP | 2645148 | 10/2013 |
| JP | 2013-205818 | 10/2013 |

OTHER PUBLICATIONS

Extended European search report for European Patent Application No. 17190927.8 dated Mar. 9, 2018.

* cited by examiner

*Primary Examiner* — Euncha P Cherry
(74) *Attorney, Agent, or Firm* — IPUSA, PLLC

(57) ABSTRACT

An optical scanning device according to an embodiment of the present invention includes a mirror that has an optical reflection surface; a movable frame that supports the mirror; a pair of drive beams that support the movable frame from both sides; drive sources that are disposed on the drive beams and cause the movable frame to be swung around a predetermined axis that passes through the center of the optical reflection surface; and a fixed frame that supports the drive beams. A movable frame connection part, via which the movable frame and one of the drive beams are connected, is substantially arranged on a side opposite to a side on which a fixed frame connection part, via which the fixed frame and the one of the drive beams are connected, is arranged, with respect to the predetermined axis.

6 Claims, 11 Drawing Sheets f0: VERTICAL MODE f1: TILT MODE

OPTICAL SCANNING DEVICE

BACKGROUND OF THE INVENTION

1. Field of the Invention

The present invention relates to an optical scanning device.

2. Description of the Related Art

Conventionally, an optical scanning device is known that includes a movable plate that has an optical reflection surface for reflecting incident light, a torsion beam that supports the movable plate in such a way that the movable plate is enabled to rotate around the torsion beam, and a drive source that applies a force in a twisting direction to the torsion beam.

In case of using the above-described optical scanning device for an image display device, if scanning speed is not constant, an image will be distorted in a scanning direction. Therefore, only an area in which the scanning speed is constant is used for displaying an image. In order to make the scanning speed constant, it is required that a voltage with high linearity, i.e., a voltage whose waveform has a long straight line section in one period can be applied to the drive source.

Therefore, conventionally, a section, in which the scanning speed of the optical scanning device is constant, is caused to be longer by applying a voltage that has a sawtooth waveform to the drive source (e.g., refer to Patent Document 1). With respect to the above, when a voltage that has a sawtooth waveform is applied to the drive source, due to frequency components corresponding to the mechanical natural frequency related to driving a mirror, and due to harmonic components of the natural frequency, what is known as a ringing phenomenon occurs when driving the mirror. Therefore, the frequency components corresponding to the natural frequency and the harmonic components of the natural frequency are removed by using a filter such as a notch filter.

CITATION LIST

Patent Document

[Patent Document 1] Japanese Unexamined Patent Application Publication No. 2013-205818

SUMMARY OF THE INVENTION

Technical Problem

However, in a case where multiple natural vibration modes exist, it is necessary to use multiple filters for removing the frequency components corresponding to the natural frequency and the harmonic components of the natural frequency. However, when multiple filters are used, the linearity of a voltage applied to the drive source decreases, and a section, in which the scanning speed of the optical scanning device is constant, is decreased. As a result, an area that can be used for displaying an image becomes smaller.

The present invention has been made in view of the above. An object of the present invention is to provide an optical scanning device that can, not only secure an area usable for displaying an image, but also reduce occurrences of the ringing phenomenon.

Solution to Problem

In order to achieve the above-described object, an optical scanning device (1000) according to an aspect of the present invention includes a mirror (110) that has an optical reflection surface; a movable frame (160) that supports the mirror (110); a pair of drive beams (170A, 170B) that support the movable frame (160) from both sides; drive sources (171A, 171B) that are disposed on the drive beams (170A, 170B) and cause the movable frame (160) to be swung around a predetermined axis that goes through the center of the optical reflection surface; and a fixed frame (180) that supports the drive beams (170A, 170B). A movable frame connection part, via which the movable frame (160) and one of the drive beams (170A, 170B) are connected, is substantially arranged on a side opposite to a side on which a fixed frame connection part, via which the fixed frame (180) and the one of the drive beams (170A, 170B) are connected, is arranged, with respect to the predetermined axis.

It should be noted that reference numerals in the above parentheses are provided in order to facilitate easy understanding, are just examples, and are not limited to aspects illustrated in the drawings.

Advantageous Effects of Invention

According to an embodiment of the present invention, it is possible, not only to secure an area that can be used for displaying an image, but also to reduce occurrences of the ringing phenomenon.

DETAILED DESCRIPTION OF THE PREFERRED EMBODIMENTS

Figure 1:
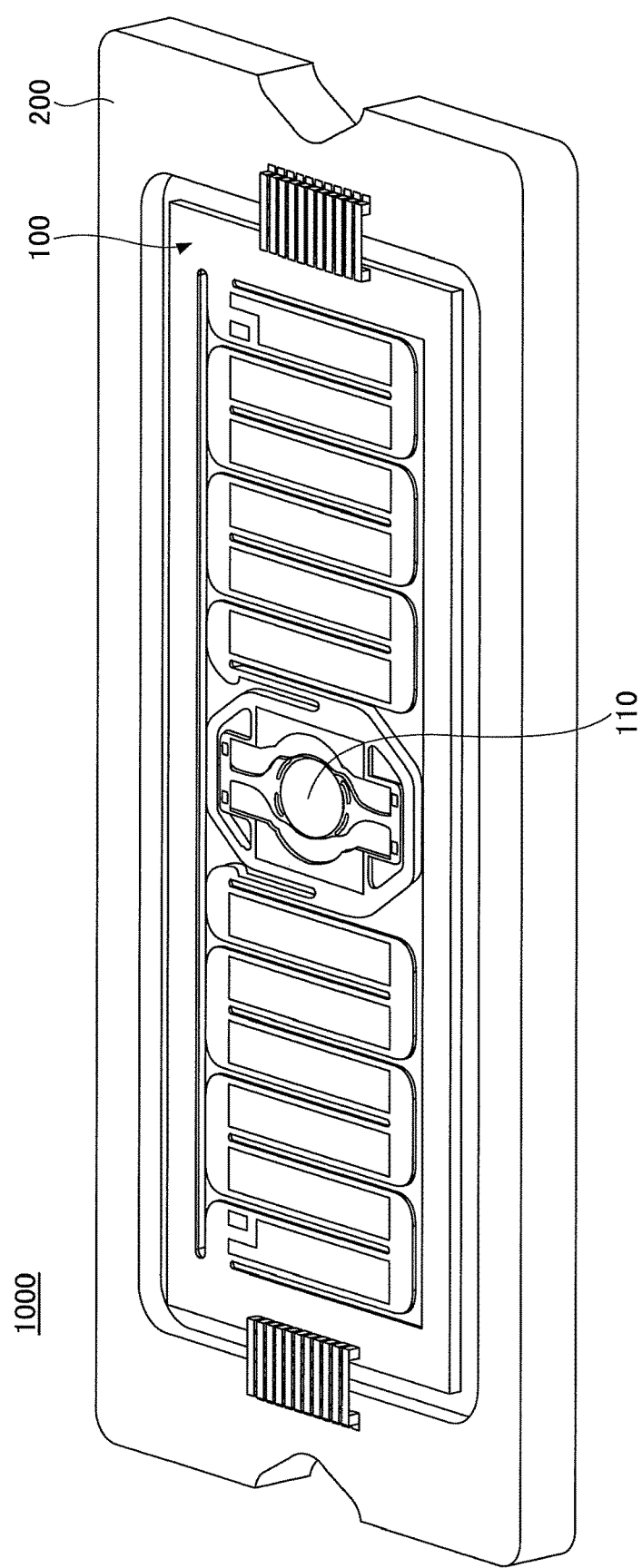
FIG. 1 is a perspective view (1) illustrating an example of an optical scanning device according to a first embodiment of the present invention.

In the following, embodiments of the present invention will be described while making reference to the drawings.

Throughout the drawings, a same reference numeral is given to a same element, and duplicated descriptions may be omitted.

(First Embodiment)

Figure 2:
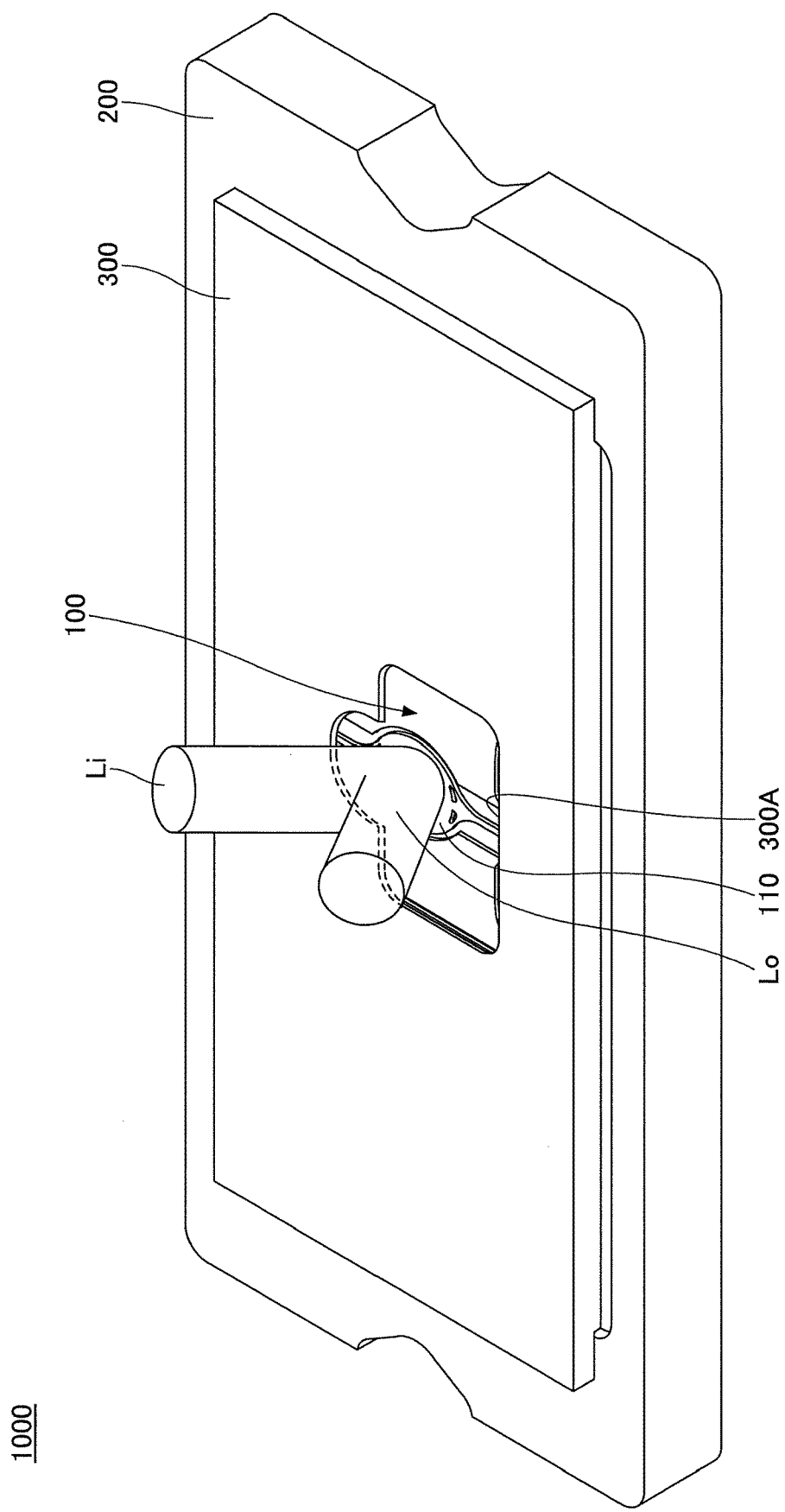
FIG. 2 is a perspective view (2) illustrating an example of an optical scanning device according to the first embodiment.

First, an optical scanning device according to a first embodiment of the present invention will be described. FIG. 1 and FIG. 2 are perspective views illustrating an example of an optical scanning device 1000 according to the first embodiment. FIG. 1 illustrates the optical scanning device 1000 in a state in which a package cover is detached. FIG. 2 illustrates the optical scanning device 1000 in a state in which the package cover is attached.

As illustrated in FIG. 1 and FIG. 2, the optical scanning device 1000 includes an optical scanning unit 100, a ceramic package 200 on which the optical scanning unit 100 is mounted, and a package cover 300 that is arranged on the ceramic package 200 and that covers the optical scanning unit 100. The optical scanning device 1000 may include a substrate, a control circuit, etc., on lower side of the ceramic package 200.

In the optical scanning device 1000, at substantially the center part of the package cover 300, an opening 300A is provided from which the vicinity of a mirror 110 that has an optical reflection surface is exposed. It is assumed that the opening 300A has a shape such that incident laser light Li that is incident onto the mirror 110 and outgoing laser light Lo (scanning light) are not blocked. It should be noted that, in the opening 300A, the side, through which the incident laser light Li passes, has a smaller opening than the side through which the outgoing laser light Lo passes. In other words, the incident laser light Li side of the opening 300A has a smaller opening with substantially a semicircular shape, and the outgoing laser light Lo side of the opening 300A has a larger opening with substantially a rectangle shape. This is because the incident laser light Li is incident from a fixed direction, and thus, the opening should be provided only for the fixed direction. On the other hand, the outgoing laser light Lo is scanned in two dimensions, and thus, the opening should be provided for all of the scanning range so that the outgoing laser light Lo, which is scanned in two dimensions, is not blocked.

Figure 3:
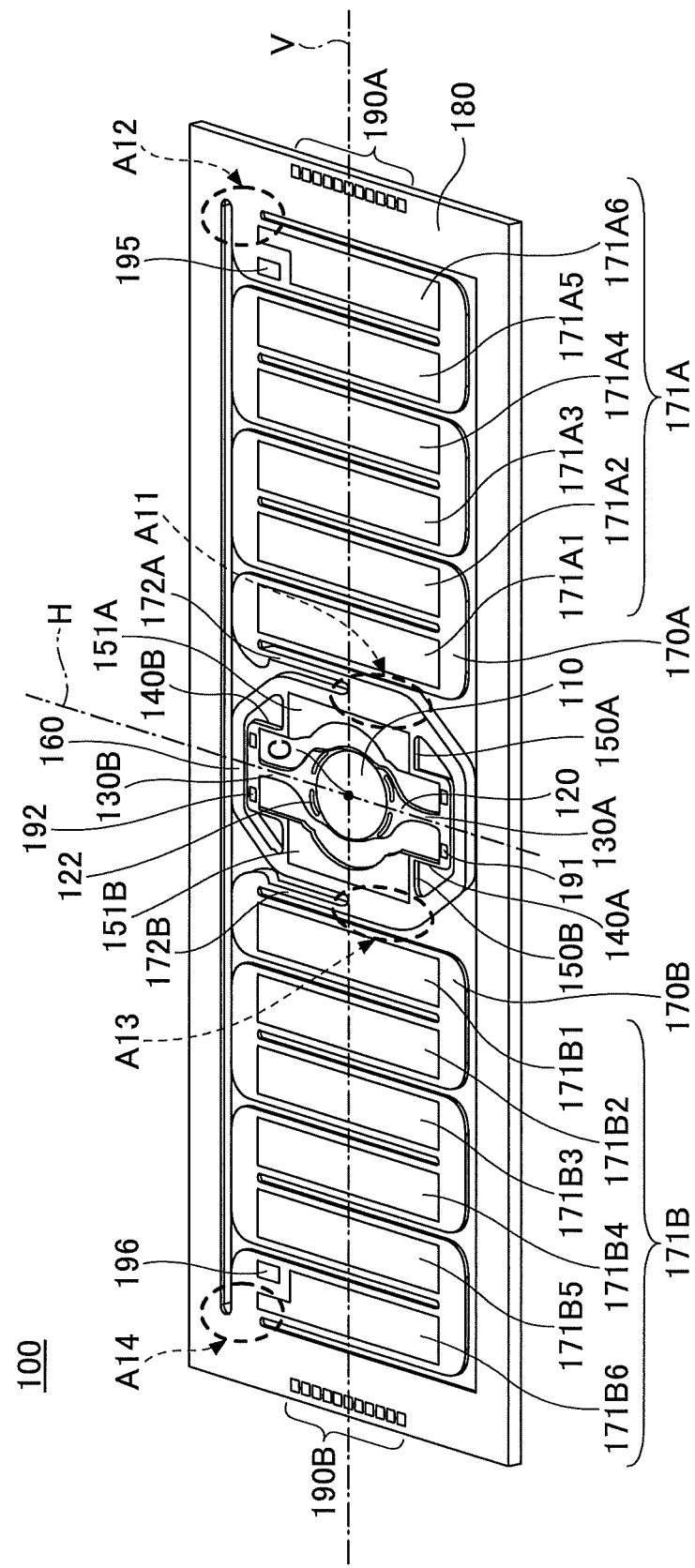
FIG. 3 is an upper surface side perspective view illustrating an example of an optical scanning unit of an optical scanning device according to the first embodiment.

Next, an optical scanning unit 100 of the optical scanning device 1000 will be described. FIG. 3 is an upper surface side perspective view illustrating an example of the optical scanning unit 100 of the optical scanning device 1000 according to the first embodiment.

As illustrated in FIG. 3, the optical scanning unit 100 causes the laser light emitted from the light source to be scanned by causing the mirror 110 to be swung. The optical scanning unit 100 may be, for example, a MEMS (Micro Electro Mechanical Systems) mirror that drives the mirror 110 by using a piezoelectric element.

The optical scanning unit 100 includes a mirror 110 that has an optical reflection surface, a movable frame 160 that supports the mirror 110 from outside, and a pair of drive beams 170A, 170B that support the movable frame 160 from both sides. Further, a movable frame connection part A11, via which the movable frame 160 and the second drive beam 170A are connected, is arranged on a substantially opposite side to a side on which a fixed frame connection part A12, via which the fixed frame 180 and the second drive beam 170A are connected, is arranged, with respect to an axis that passes through the center C of the optical reflection surface of the mirror 110 (hereinafter, referred to as "vertical rotational axis V"). Further, a movable frame connection part A13, via which the movable frame 160 and the second drive beam 170B are connected, is arranged on a substantially opposite side to a side on which a fixed frame connection part A14, via which the fixed frame 180 and the second drive beam 170B are connected, is arranged, with respect to the vertical rotational axis V. Further, the movable frame connection parts A11, A13 may be arranged on a side opposite to a side, on which the fixed frame connection parts A12, A14 are arranged, with respect to the vertical rotational axis V in such a way that end portions of the movable frame connection parts A11, A13 include the vertical rotational axis V. Further, the second drive beam 170A and the second drive beam 170B are arranged so as to have line symmetry with respect to an axis of symmetry that passes through the center C of the optical reflection surface of the mirror 110 and that is orthogonal to the vertical rotational axis V (hereinafter, referred to as "horizontal rotational axis H"). The detail will be described in the following.

The optical scanning unit 100 includes the mirror 110, a mirror support unit 120, twist beams 130A, 130B, connection beams 140A, 140B, first drive beams 150A, 150B, the movable frame 160, the second drive beams 170A, 170B, and the fixed frame 180. Further, the first drive beams 150A, 150B include drive sources 151A, 151B, respectively. Further, the second drive beams 170A, 170B include drive sources 171A, 171B, respectively. The first drive beams 150A, 150B and the second drive beams 170A, 170B function as actuators that cause the mirror 110 to be swung in an up-and-down direction (vertical direction) and in a left-and-right direction (horizontal direction) and cause the laser light to be scanned.

In the mirror support unit 120, slits 122 are formed along the circumference of the mirror 110. According to the slits 122, not only the weight of the mirror support unit 120 is decreased, but also the twisting caused by the twist beams 130A, 130B can be transmitted to the mirror 110.

In the optical scanning unit 100, the mirror 110 is supported by an upper surface of the mirror support unit 120, and the mirror support unit 120 is connected to end portions of the twist beams 130A, 130B that are disposed on both sides of the mirror support unit 120. A swing axis is formed by the twist beams 130A, 130B. The twist beams 130A, 130B are disposed in the swing axis direction and support the mirror support unit 120 from both sides in the axial direction. The twisting of the twist beams 130A, 130B causes the mirror 110, which is supported by the mirror support unit 120, to be swung, and the light, which has been emitted to the mirror 110 and reflected by the mirror 110, is caused to be scanned. The twist beams 130A, 130B are connected to, and supported by the connection beams 140A, 140B, and connected to the first drive beams 150A, 150B.

The first drive beams 150A, 150B, the connection beams 140A, 140B, the twist beams 130A, 130B, the mirror support unit 120, and the mirror 110 are supported by the movable frame 160 from outside. One side of the first drive beam 150A and one side of the first drive beam 150B are supported by the movable frame 160. The other side of the first drive beam 150A extends to the inner circumference side and is connected to the connection beams 140A, 140B. Similarly, the other side of the first drive beam 150B extends to the inner circumference side and is connected to the connection beams 140A, 140B.

The first drive beams 150A, 150B are provided as a pair in a direction orthogonal to the twist beams 130A, 130B in such a way that the mirror 110 and the mirror support unit 120 are sandwiched by the first drive beams 150A, 150B. Drive sources 151A, 151B are formed on the upper surfaces of the first drive beams 150A, 150B, respectively. The drive sources 151A, 151B include upper electrodes formed on thin films of piezoelectric elements (hereinafter, referred to as "piezoelectric thin films") on upper surfaces of the first drive beams 150A, 150B, and lower electrodes formed on lower surfaces of the piezoelectric thin films. The drive sources 151A, 151B expand and contract according to the polarity of the drive voltage applied to the upper electrodes and the lower electrodes.

Therefore, by alternately applying drive voltages that have phases different from each other to the first drive beam 150A and the first drive beam 150B, the first drive beam 150A and the first drive beam 150B, disposed on the left side and the right side of the mirror 110, are caused to oscillate in a vertical direction opposite to each other. According to this operation, it is possible to cause the mirror 110 to be swung around the twisting beams 130A, 130B as a swing axis or a rotational axis. Hereinafter, the direction, in which the mirror 110 is swung around the twisting beams 130A, 130B as an axis, is referred to as a horizontal direction. Resonance vibration, for example, can be used for the horizontal drive by the first drive beams 150A, 150B, and can be used for quickly driving the mirror 110 to be swung.

Further, one end of the second drive beam 170A and one end of the second drive beam 170B are connected to the outside of the movable frame 160 at movable frame connection parts A11, A13 via the connection beams 172A, 172B, respectively. The second drive beams 170A, 170B are provided as a pair in such a way that the movable frame 160 is sandwiched from left side and right side by the second drive beams 170A, 170B. Further, the second drive beams 170A, 170B support the movable frame 160 from both sides, and cause the movable frame 160 to be swung around the vertical rotational axis V. The second drive beam 170A has a zigzag shape as a whole by having each of a plural number (e.g., even number) of rectangle beams, which are disposed in parallel with the first drive beam 150A, connected to an adjacent rectangle beam at the end. Further, the other end of the second drive beam 170A is connected to the inside of the fixed frame 180 at the fixed frame connection part A12. Similarly, the second drive beam 170B has a zigzag shape as a whole by having each of a plural number (e.g., even number) of rectangle beams, which are disposed in parallel with the first drive beam 150B, connected to an adjacent rectangle beam at the end. Further, the other end of the second drive beam 170B is connected to the inside of the fixed frame 180 at the fixed frame connection part A14. As described above, in the optical scanning unit 100, the movable frame connection part A11, via which the movable frame 160 and the second drive beam 170A are connected, is arranged on a side substantially opposite to a side on which the fixed frame connection part A12, via which the fixed frame 180 and the second drive beam 170A are connected, is arranged, with respect to the vertical rotational axis V. Further, in the optical scanning unit 100, the movable frame connection part A13, via which the movable frame 160 and the second drive beam 170B are connected, is arranged on a side substantially opposite to a side on which the fixed frame connection part A14, via which the fixed frame 180 and the second drive beam 170B are connected, is arranged, with respect to the vertical rotational axis V. Further, the movable frame connection parts A11, A13 may be arranged on a side opposite to a side on which the fixed frame connection parts A12, A14 are arranged, with respect to the vertical rotational axis V in such a way that end portions of the movable frame connection parts A11, A13 include the vertical rotational axis V. Furthermore, the second drive beam 170A and the second drive beam 170B are arranged in a line symmetric relationship that has the horizontal rotational axis H as a symmetry axis.

On upper surfaces of the second drive beams 170A, 170B, drive sources 171A, 171B are formed as rectangle units that do not include curved portions. The drive source 171A includes an upper electrode, formed on the piezoelectric thin film on the upper surface of the second drive beam 170A, and a lower electrode, formed on the lower surface of the piezoelectric thin film. The drive source 171B includes an upper electrode, formed on the piezoelectric thin film on the upper surface of the second drive beam 170B, and a lower electrode, formed on the lower surface of the piezoelectric thin film.

By applying drive voltages that have polarities different from each other to adjacent rectangle units of drive sources 171A, 171B, the second drive beams 170A, 170B cause adjacent rectangle beams to warp vertically in directions opposite to each other, and transmit accumulated vertical movements of the rectangle beams to the movable frame 160. According to this operation of the second drive beams 170A, 170B, the mirror 110 is caused to be swung in a vertical direction that is orthogonal to the parallel direction. For example, non-resonant vibration can be used for the vertical drive by the second drive beams 170A, 170B.

For example, it is assumed that the drive source 171A includes drive sources 171A1, 171A2, 171A3, 171A4, 171A5, and 171A6 that are disposed sequentially from the movable frame 160 side toward the right side. Further, it is assumed that the drive source 171B includes drive sources 171B1, 171B2, 171B3, 171B4, 171B5, and 171B6 that are disposed sequentially from the movable frame 160 side toward the left side. In this case, by driving the drive sources 171A1, 171B1, 171A3, 171B3, 171A5, and 171B5 with a first same waveform voltage, and by driving the drive sources 171A2, 171B2, 171A4, 171B4, 171A6, and 171B6 with a second same waveform voltage different from the first same waveform voltage, it is possible to cause the mirror 110 to be swung in the vertical direction.

Drive wires used for applying drive voltages to an upper electrode and a lower electrode of the drive source 151A are connected to predetermined terminals included in a group of terminals 190A disposed on the fixed frame 180. Further, drive wires used for applying drive voltages to an upper electrode and a lower electrode of the drive source 151B are connected to predetermined terminals included in a group of terminals 190B disposed on the fixed frame 180. Further, drive wires used for applying upper electrodes and lower electrodes of the drive source 171A are connected to predetermined terminals included in the group of terminals 190A disposed on the fixed frame 180. Further, drive wires used for applying upper electrodes and lower electrodes of the drive source 171B are connected to predetermined terminals included in the group of terminals 190B disposed on the fixed frame 180.

Further, the optical scanning unit 100 includes piezoelectric sensors 191, 192 as horizontal swing angle sensors that detect a tilted degree of the mirror 110 in the horizontal direction (swing angle in the horizontal direction) in a state where the drive voltages are applied to the drive sources 151A, 151B and where the mirror 110 is caused to be swung in the horizontal direction. The piezoelectric sensor 191 is disposed on the connection beam 140A and the piezoelectric sensor 192 is disposed on the connection beam 140B.

Further, the optical scanning unit 100 includes piezoelectric sensors 195, 196 as vertical swing angle sensors that detect a tilted degree of the mirror 110 in the vertical direction (swing angle in the vertical direction) in a state where the drive voltages are applied to the drive sources 171A, 171B and where the mirror 110 is caused to be swung in the vertical direction. The piezoelectric sensor 195 is disposed on one of the rectangle beams included in the second drive beam 170A and the piezoelectric sensor 196 is disposed on one of the rectangle beams included in the second drive beam 170B.

The piezoelectric sensor 191 outputs a current value corresponding to a displacement of the connection beam 140A transmitted from the twist beam 130A according to a tilted degree of the mirror 110 in the horizontal direction. The piezoelectric sensor 192 outputs a current value corresponding to a displacement of the connection beam 140B transmitted from the twist beam 130B according to a tilted degree of the mirror 110 in the horizontal direction. The piezoelectric sensor 195 outputs a current value corresponding to a displacement of the rectangle beam of the second drive beam 170A on which the piezoelectric sensor 195 is disposed, according to a tilted degree of the mirror 110 in the vertical direction. The piezoelectric sensor 196 outputs a current value corresponding to a displacement of the rectangle beam of the second drive beam 170B on which the piezoelectric sensor 196 is disposed, according to a tilted degree of the mirror 110 in the vertical direction.

In the first embodiment, a tilted degree of the mirror 110 in the horizontal direction is detected by using the piezoelectric sensors 191, 192, and a tilted degree of the mirror 110 in the vertical direction is detected by using the piezoelectric sensors 195, 196. It should be noted that a tilted degree detection unit, which detects tilted degrees of the mirror 110 according to the current values output from the piezoelectric sensors, may be provided outside of the optical scanning unit 100. Further, a drive control unit, which controls drive voltages supplied to the drive sources 151A, 151B, drive sources 171A, 171B based on a detection result of the tilted degree detection unit, may be provided outside of the optical scanning unit 100.

The piezoelectric sensors 191, 192, 195, 196 include upper electrodes formed on upper surfaces of piezoelectric thin films and include lower electrodes formed on lower surfaces of the piezoelectric thin films. In the first embodiment, outputs from the piezoelectric sensors are current values of the sensor wires connected to the upper electrodes and the lower electrodes.

Sensor wires drawn out from the upper electrode and the lower electrode of the piezoelectric sensor 191 are connected to predetermined terminals included in the group of terminals 190B disposed on the fixed frame 180. Further, sensor wires drawn out from the upper electrode and the lower electrode of the piezoelectric sensor 195 are connected to predetermined terminals included in the group of terminals 190A disposed on the fixed frame 180. Further, sensor wires drawn out from the upper electrode and the lower electrode of the piezoelectric sensor 192 are connected to predetermined terminals included in the group of terminals 190B disposed on the fixed frame 180. Further, sensor wires drawn out from the upper electrode and the lower electrode of the piezoelectric sensor 196 are connected to predetermined terminals included in the group of terminals 190B disposed on the fixed frame 180.

Figure 4:
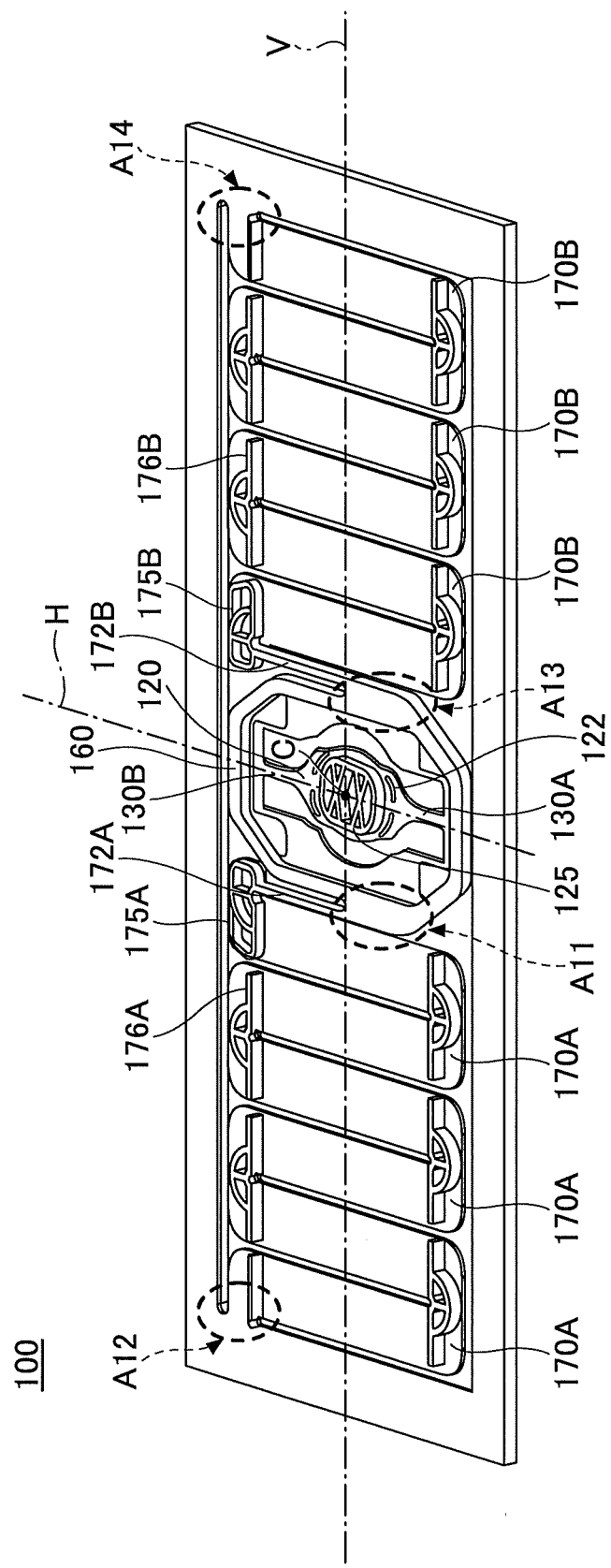
FIG. 4 is a lower surface side perspective view illustrating an example of an optical scanning unit of an optical scanning device according to the first embodiment.

FIG. 4 is a lower surface side perspective view illustrating an example of an optical scanning unit of an optical scanning device according to the first embodiment.

As illustrated in FIG. 4, a rib 125 is provided on a lower surface of the mirror support unit 120. By providing the rib 125, it is possible to reduce occurrences of distortion of the mirror 110 and to keep the mirror 110 flat when driving the mirror 110. The rib 125 is formed in such a way that the outline of the rib 125 substantially matches the shape of the mirror 110. With this arrangement, it is possible to keep the entire mirror 110 flat. Further, by providing the slits 122 formed in the mirror support unit 120, it is possible to distribute a stress transmitted from the twist beams 130A, 130B in the mirror support unit 120, and to prevent the stress from being transmitted to the rib 125.

In lower surfaces of the second drive beams 170A, 170B, ribs 175A, 175B are provided at connection portions that are connected to the connection beams 172A, 172B. By providing the ribs 175A, 175B, the portions, via which the second drive beams 170A, 170B and the connection beams 172A, 172B are connected, are reinforced, and deformations are prevented by the increased rigidity. Further, in lower surfaces of the second drive beams 170A, 170B, ribs 176A, 176B are provided at connection portions via which adjacent drive beams are connected to each other. By providing the ribs 176A, 176B, the portions, via which adjacent drive beams are connected to each other, are reinforced, and deformations are prevented by the increased rigidity.

Figure 5:
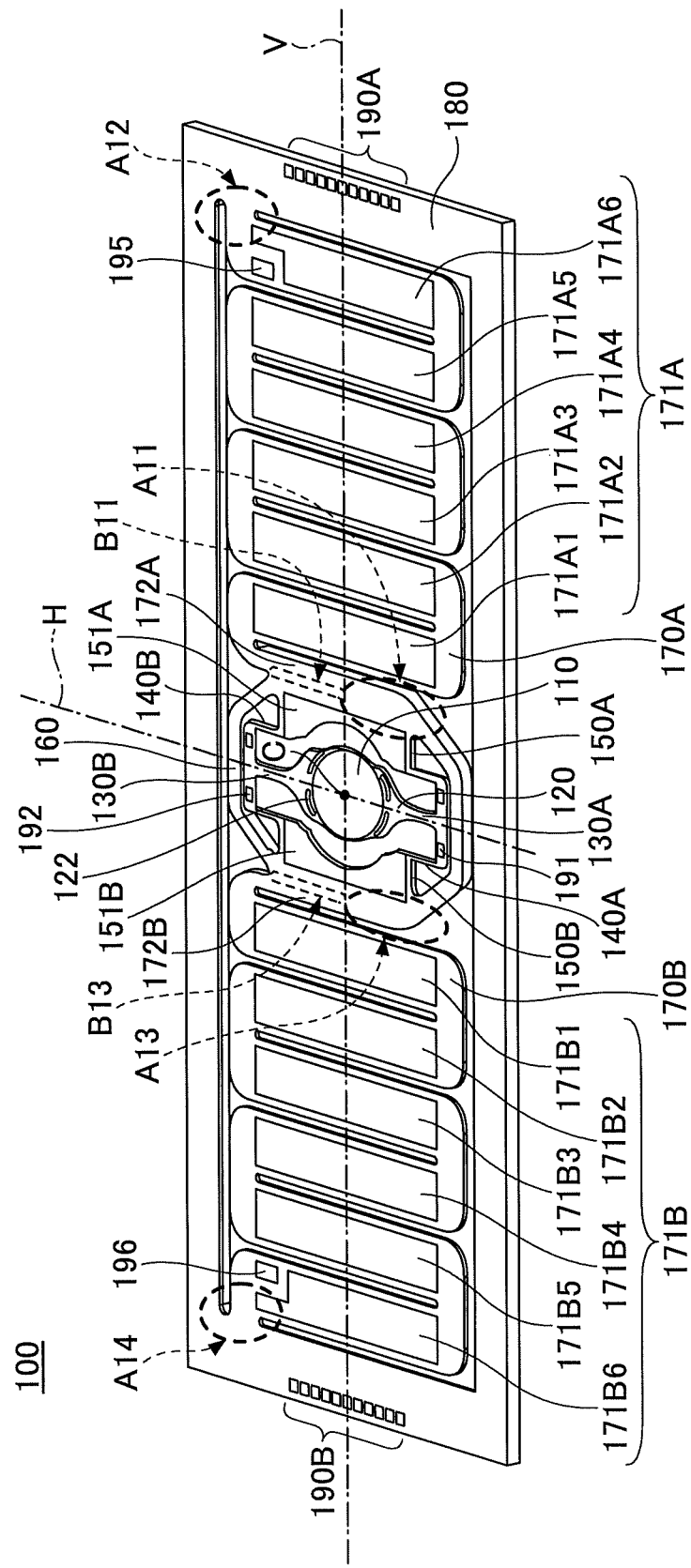
FIG. 5 is an upper surface side perspective view illustrating another example of an optical scanning unit of an optical scanning device according to the first embodiment.
Figure 6:
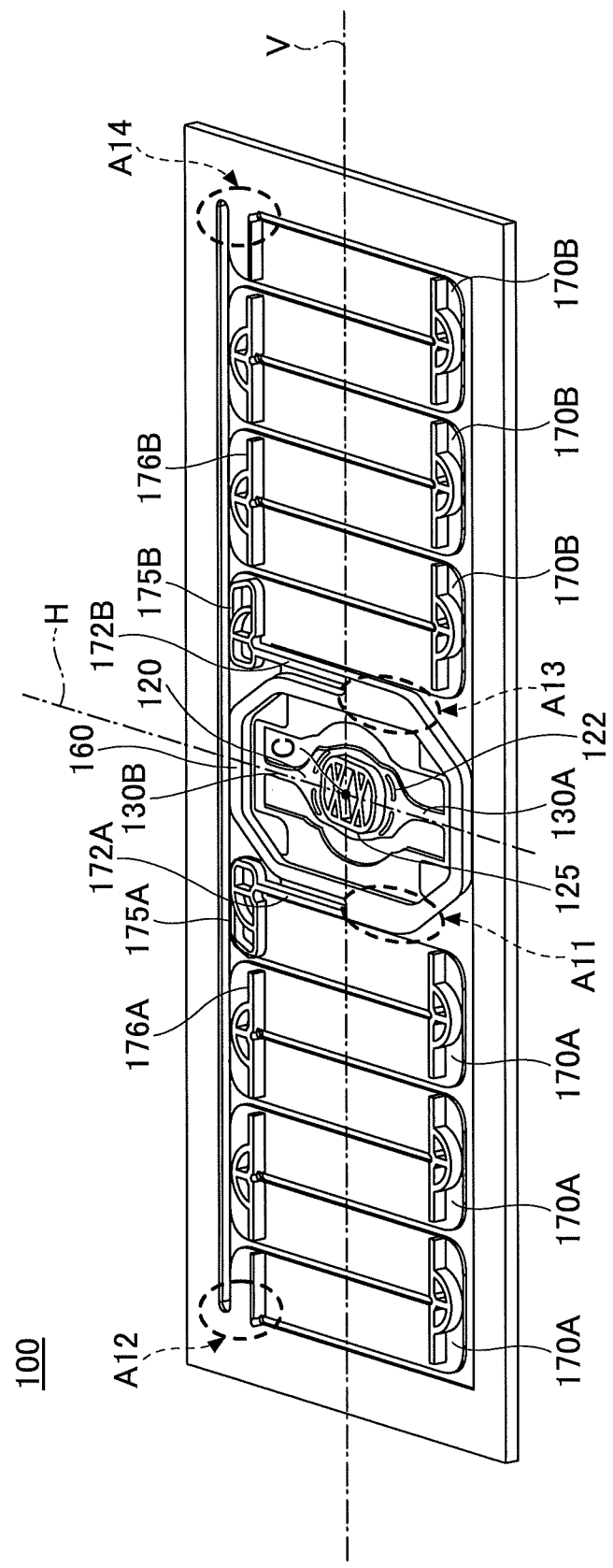
FIG. 6 is a lower surface side perspective view illustrating another example of an optical scanning unit of an optical scanning device according to the first embodiment.

FIG. 5 is an upper surface side perspective view illustrating another example of an optical scanning unit of an optical scanning device according to the first embodiment. FIG. 6 is a lower surface side perspective view illustrating another example of an optical scanning unit of an optical scanning device according to the first embodiment.

The optical scanning unit 100 can be formed by using, for example, a SOI (Silicon On Insulator) substrate that has a support layer, a buried oxide (BOX) layer, and an active layer. In this case, as illustrated in FIG. 5 and FIG. 6, the connection beams 172A, 172B may be connected to the movable frame 160 via the active layer and the BOX layer. It should be noted that, in FIG. 5, a portion, in which the connection beam 172A is connected to the movable frame 160 via the active layer and the BOX layer, is indicated by a dashed line area B11, and a portion, in which the connection beam 172B is connected to the movable frame 160 via the active layer and the BOX layer, is indicated by a dashed line area B13. Further, the connection beams 172A, 172B may be connected to the movable frame 160 via the active layer alone.

Figure 7:
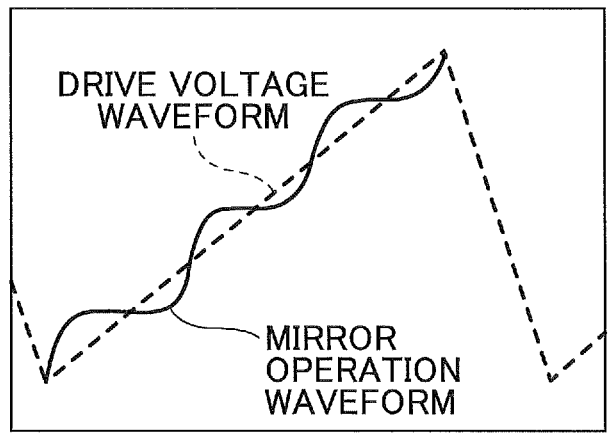
FIG. 7 is a drawing illustrating relationship between a voltage waveform applied to the drive source and an operation waveform of the mirror.
Figure 8:
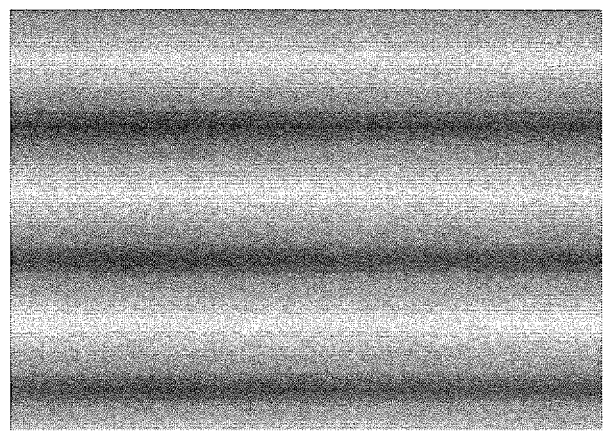
FIG. 8 is a drawing illustrating a state in which displaying an image is performed by using an optical scanning device.

Next, operations of the optical scanning device 1000 will be described. FIG. 7 is a drawing illustrating relationship between a voltage waveform applied to the drive sources 171A, 171B and an operation waveform of the mirror 110. In FIG. 7, the drive voltage waveform is indicated by a dashed line, and the mirror operation waveform is indicated by a solid line. FIG. 8 is a drawing illustrating a state in which the optical scanning device 1000 is used for displaying an image.

As illustrated in FIG. 7, for example, a voltage that has a sawtooth waveform is applied to the drive sources 171A, 171B. According to the above operation, a section, in which the light scanning speed by the mirror 110 is constant, is caused to be longer than a case in which a voltage that has, for example, a sine waveform is applied.

With respect to the above, when the mirror 110 is driven by applying a voltage that has a sawtooth waveform to the drive source 171A, 171B, for example, as illustrated in FIG. 7, what is known as a ringing phenomenon, in which the operation waveform of the mirror 110 includes vibrations, occurs. Further, when the ringing phenomenon occurs, in a case where the optical scanning device 1000 is used for displaying an image, horizontal stripes are generated as illustrated in FIG. 8.

Therefore, in order to reduce occurrences of the ringing phenomenon, a filter such as a notch filter is used for removing frequency components corresponding to the natural frequency and harmonic components of the natural frequency that cause the ringing phenomenon to occur.

However, in a case where there are multiple natural vibration modes that need to be removed, it is necessary to use multiple filters in order to remove the frequency components corresponding to the natural frequencies and the harmonic components of the natural frequencies. However, when multiple filters are used: the linearity of a voltage applied to the drive sources is decreased; a section, in which the scanning speed of the optical scanning device is constant, is caused to be shorter; and an area, which can be used for displaying an image, becomes smaller. Therefore, in order, not only to secure an area that can be used for displaying an image, but also to reduce occurrences of the ringing phenomenon, it is effective to reduce the number of the natural vibration modes that need to be removed.

Figure 9A:
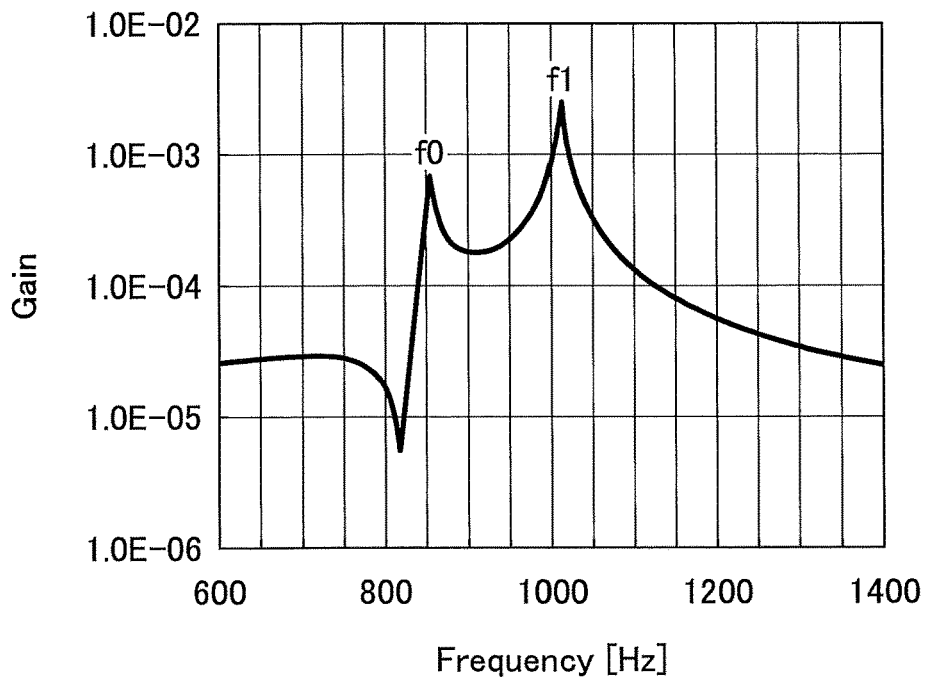
FIGS. 9A-9B are drawings illustrating frequency characteristics of optical scanning devices.
Figure 9B:
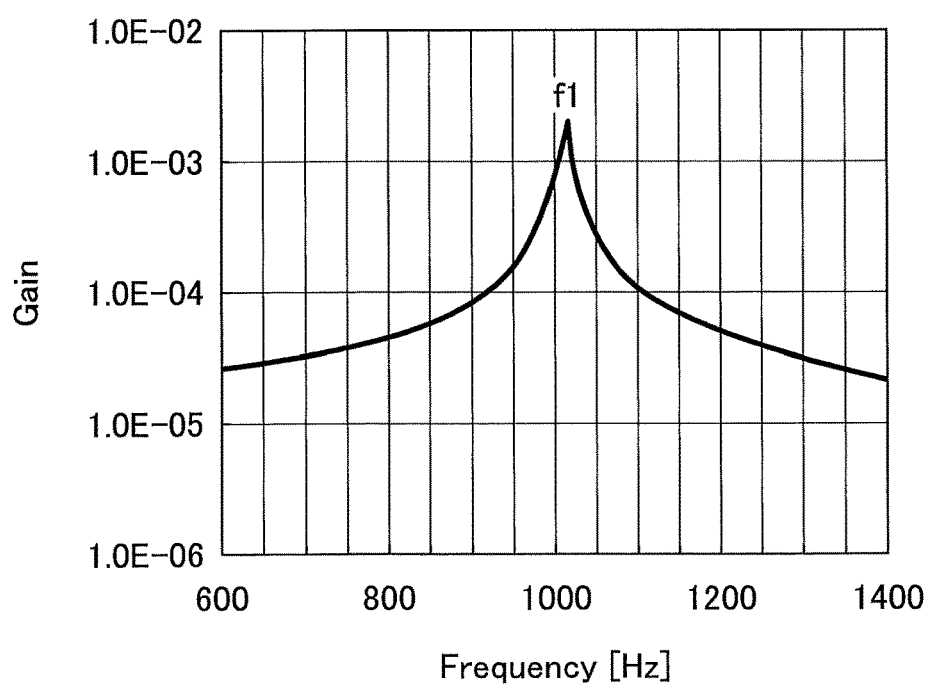

FIGS. 9A-9B are drawings illustrating frequency characteristics of optical scanning devices. FIG. 9A illustrates frequency characteristics of a conventional optical scanning device. FIG. 9B illustrates frequency characteristics of an optical scanning device according to the first embodiment. In FIG. 9A and FIG. 9B, a horizontal axis indicates frequency (Hz) and a vertical axis indicates gain. It should be noted that the conventional optical scanning device means a device in which movable frame connection parts, via which the movable frame 160 and the second drive beams 170A, 170B are connected, and fixed frame connection parts, via which the fixed frame 180 and the second drive beams 17A, 170B are connected, are arranged on the same side with respect to the vertical rotational axis V.

Figure 10A:
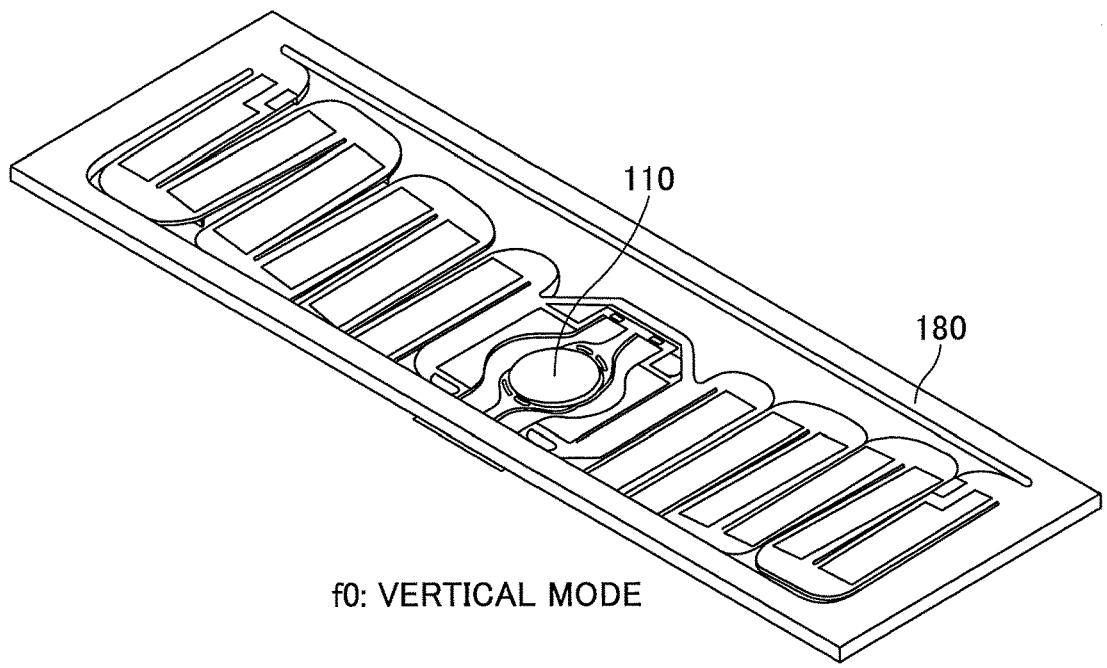
FIGS. 10A-10B are drawings illustrating natural vibration modes.
Figure 10B:
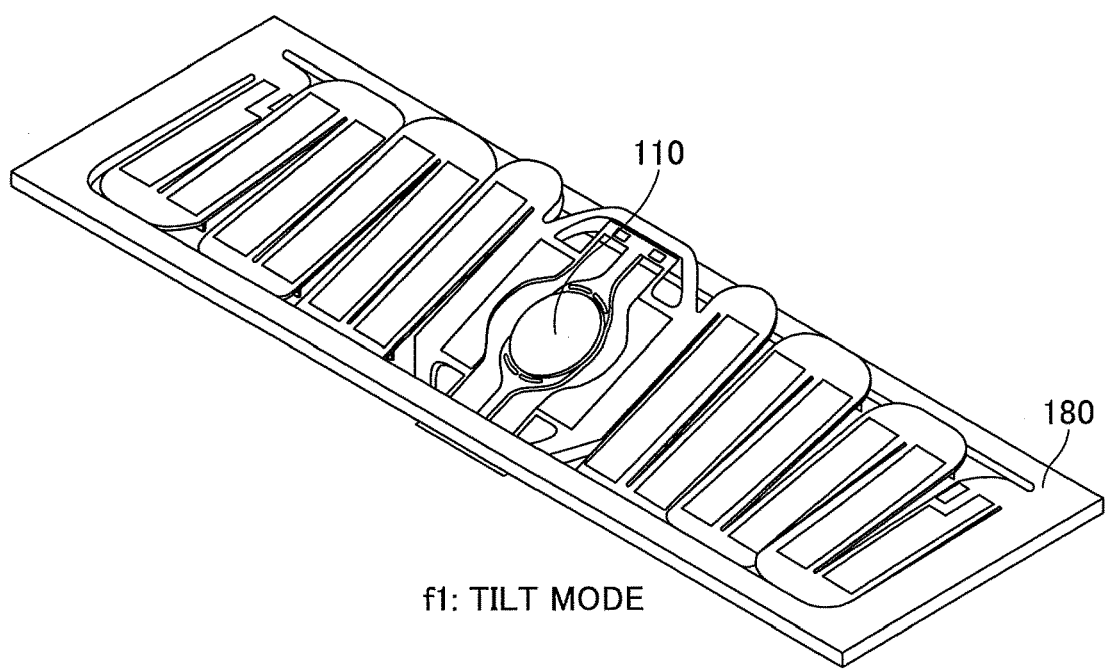

As illustrated in FIG. 9A, in the conventional optical scanning device, the natural vibration mode of the optical scanning unit appeared at frequencies f0 (near 850 Hz) and f1 (near 1000 Hz). On the other hand, as illustrated in FIG. 9B, in an optical scanning device according to the first embodiment, the natural vibration mode of the optical scanning unit appeared only at frequency f1 (near 1000 Hz). It should be noted that the natural vibration mode at frequency f0 is, as illustrated in FIG. 10A, a vertical mode in which the mirror 110, etc., oscillate vertically (up and down) with respect to the fixed frame 180. Further, the natural vibration mode at frequency f1 is a tilt mode in which the mirror 110, etc., oscillate in such a way that the mirror 110, etc., are tilted with respect to the fixed frame 180. It should be noted that FIGS. 10A-10B are drawings illustrating natural vibration modes.

As described above, in an optical scanning device 1000 according to the first embodiment, the movable frame connection part A11, via which the movable frame 160 and the second drive beam 170A are connected, is arranged on a side substantially opposite to a side on which the fixed frame connection part A12, via which the fixed frame 180 and the second drive beam 170A are connected, is arranged, with respect to the vertical rotational axis V. Further, in the optical scanning unit 100, a movable frame connection part A13, via which the movable frame 160 and the second drive beam 170B are connected, is arranged on a side substantially opposite to a side on which a fixed frame connection part A14, via which the fixed frame 180 and the second drive beam 170B are connected, is arranged, with respect to the vertical rotational axis V. According to the above arrangement, the number of the natural vibration modes can be decreased, and thus, frequency components corresponding to the natural frequency and the harmonic components of the natural frequency that cause the ringing phenomenon to occur can be removed by using a smaller number of filters. Therefore, it is possible to apply a voltage with high linearity to the drive sources 171A, 171B. In other words, a voltage whose waveform has a long straight line section in one period can be applied to the drive sources 171A, 171B. As a result, it is possible, not only to secure an area that can be used for displaying an image, but also to reduce occurrences of the ringing phenomenon.

(Second Embodiment)

Figure 11:
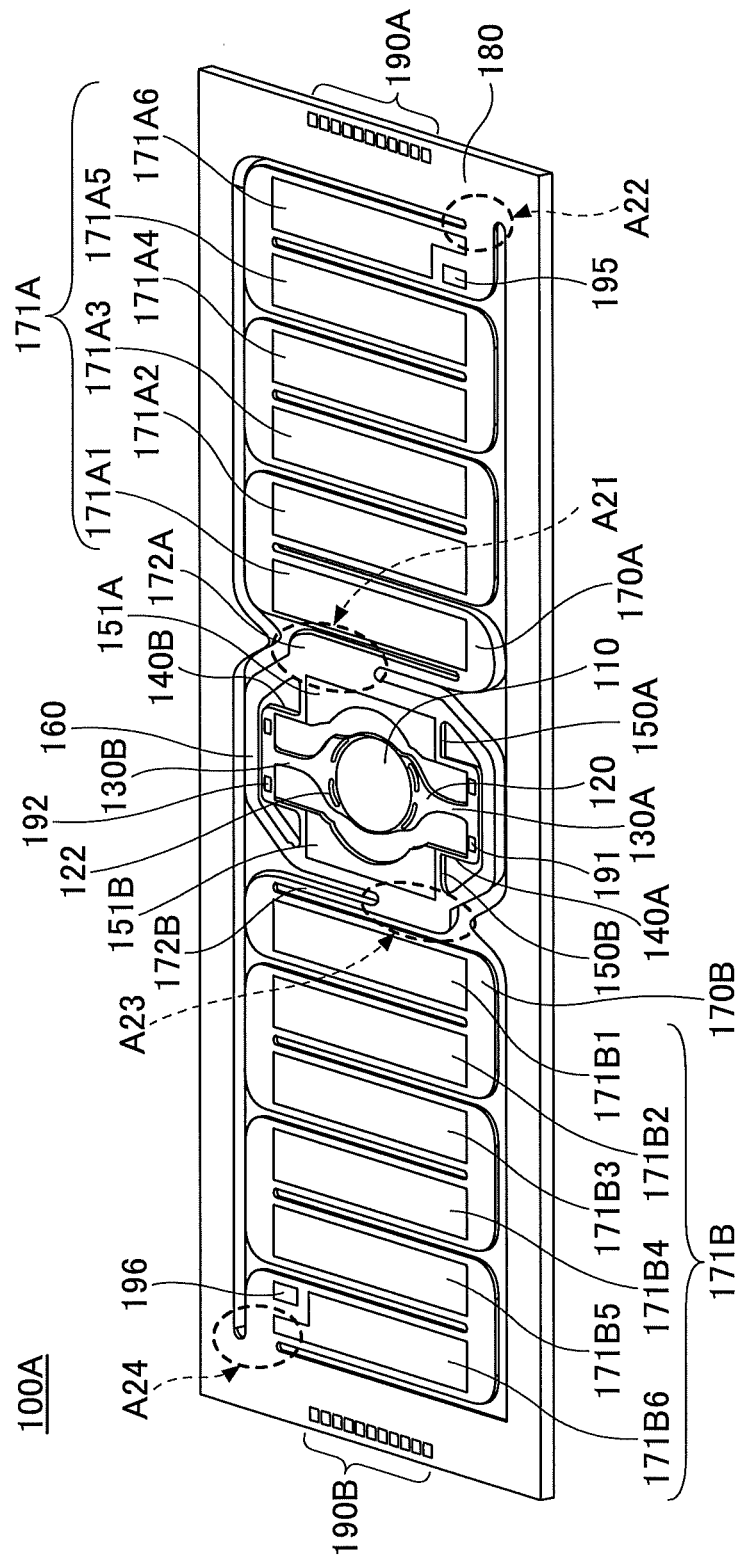
FIG. 11 is an upper surface side perspective view illustrating an example of an optical scanning unit of an optical scanning device according to a second embodiment of the present invention.
Figure 12:
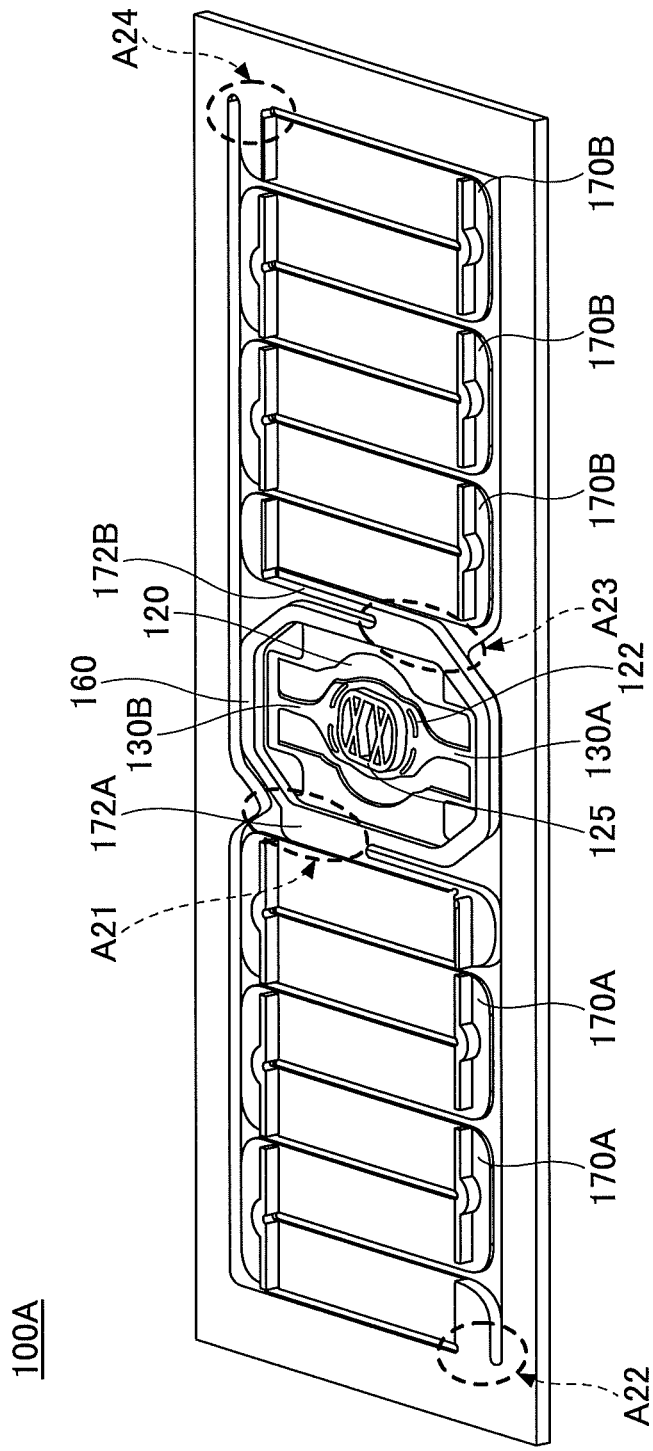
FIG. 12 is a lower surface side perspective view illustrating an example of an optical scanning unit of an optical scanning device according to the second embodiment.

An optical scanning device according to a second embodiment of the present invention will be described. FIG. 11 is an upper surface side perspective view illustrating an example of an optical scanning unit 100A of an optical scanning device according to the second embodiment. FIG. 12 is an upper surface side perspective view illustrating an example of the optical scanning unit 100A of an optical scanning device according to the second embodiment.

As illustrated in FIG. 11 and FIG. 12, the optical scanning unit 100A according to the second embodiment is different from the optical scanning unit 100 according to the first embodiment in that the second drive beam 170A and the second drive beam 170B are arranged in a point-symmetric relationship whose symmetric point is the center C of the optical reflection surface of the mirror 110. It should be noted that, other than the above, the configuration of the optical scanning unit 100A may be the same as the optical scanning unit 100 according to the first embodiment.

In the optical scanning unit 100A according to the second embodiment, similar to the first embodiment, a movable frame connection part A21, via which the movable frame 160 and the second drive beam 170A are connected, is arranged on a side substantially opposite to a side on which a fixed frame connection part A22, via which the fixed frame 180 and the second drive beam 170A are connected, is arranged, with respect to the vertical rotational axis V. Further, a movable frame connection part A23, via which the movable frame 160 and the second drive beam 170B are connected, is arranged on a side substantially opposite to a side on which a fixed frame connection part A24, via which the fixed frame 180 and the second drive beam 170B are connected, is arranged, with respect to the vertical rotational axis V.

According to the above arrangement, the number of the natural vibration modes can be decreased, and thus, frequency components corresponding to the natural frequency and the harmonic components of the natural frequency that cause the ringing phenomenon to occur can be removed by using a smaller number of filters. Therefore, it is possible to apply a voltage with high linearity to the drive sources 171A, 171B. In other words, a voltage whose waveform has a long straight line section in one period can be applied to the drive sources 171A, 171B. As a result, it is possible, not only to secure an area that can be used for displaying an image, but also to reduce occurrences of the ringing phenomenon.

As described above, preferable embodiments have been described. However, the present invention is not limited to the above-described embodiments. Various modifications and replacements can be applied to the above-described embodiments within a range described in the claim.

The present application is based on and claims the benefit of priority of Japanese Priority Application No. 2016-190260 filed on Sep. 28, 2016, the entire contents of which are hereby incorporated herein by reference.

What is claimed is:

1. An optical scanning device comprising:
a mirror that has an optical reflection surface;
a movable frame that supports the mirror;
a pair of drive beams that support the movable frame from both sides;
a drive source, disposed on the drive beams, that causes the movable frame to swing around a predetermined axis that passes through the center of the optical reflection surface; and
a fixed frame that supports the drive beams, wherein a movable frame connection part, via which the movable frame and one of the drive beams are connected, is substantially arranged on a side opposite to a side on which a fixed frame connection part, via which the fixed frame and the one of the drive beams are connected, is arranged, with respect to the predetermined axis,
wherein the movable frame connection part is arranged on the opposite side including the predetermined axis and
wherein the fixed frame connection part is arranged apart from the predetermined axis.

2. The optical scanning device according to claim 1, wherein one of the drive beams and the other of the drive beams are arranged in a line symmetry relationship that has, as an axis of symmetry, a straight line that passes through the center of the optical reflection surface and that is orthogonal to the predetermined axis.

3. The optical scanning device according to claim 1, wherein the one of the drive beams and the other of the drive beams are arranged in a point-symmetry relationship that has, as a point of symmetry, the center of the optical reflection surface.

4. The optical scanning device according to claim 1, wherein the drive beams have a zigzag shape as a whole by having each of an even number of beams, which are disposed extending in a direction orthogonal to the predetermined axis, connected to an adjacent beam at an end portion.

5. The optical scanning device according to claim 1, wherein the drive beams are connected to the movable frame via connection beams that are disposed extending in a direction orthogonal to the predetermined axis.

6. An optical scanning device comprising:
a mirror that has an optical reflection surface;
a movable frame that supports the mirror;
a pair of drive beams that support the movable frame from both sides;
an even number of drive sources, disposed on the drive beams, that causes the movable frame to swing around a predetermined axis that passes through the center of the optical reflection surface; and
a fixed frame that supports the drive beams, wherein a movable frame connection part, via which the movable frame and one of the drive beams are connected, is substantially arranged on a side opposite to a side on which a fixed frame connection part, via which the fixed frame and the one of the drive beams are connected, is arranged, with respect to the predetermined axis,
wherein the drive beams include the even number of drive sources and connection beams and have a zigzag shape as a whole, and
wherein connection locations between the connection beams and the even number of drive sources are opposite, with respect to the predetermined axis, to connection locations between the connection beams and the movable frame.

* * * * *